(12) United States Patent
Chen et al.

(10) Patent No.: US 10,330,397 B2
(45) Date of Patent: Jun. 25, 2019

(54) WATER-COOLING HEAT DISSIPATING SYSTEM AND WATER-COOLING HEAD

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/105,355

(22) Filed: Aug. 20, 2018

(65) Prior Publication Data

US 2019/0093963 A1 Mar. 28, 2019

(30) Foreign Application Priority Data

Sep. 28, 2017 (TW) .............................. 106133427 A (51) Int. Cl.
*H05K 7/20* (2006.01)
*G06F 1/20* (2006.01)
*F28F 3/12* (2006.01)
*H01L 23/473* (2006.01)

(52) U.S. Cl.
CPC .................. *F28F 3/12* (2013.01); *G06F 1/20* (2013.01); *H01L 23/473* (2013.01); *H05K 7/20254* (2013.01); *H05K 7/20263* (2013.01); *H05K 7/20272* (2013.01); *H05K 7/20772* (2013.01); *G06F 2200/201* (2013.01)

(58) Field of Classification Search
CPC ... F28F 3/12; H05K 7/20263; H05K 7/20272; G06F 1/20; G06F 2200/201; H01L 23/473
See application file for complete search history.

(56) References Cited

U.S. PATENT DOCUMENTS

| | | | |
|---|---|---|---|
| 9,210,831 B2 * | 12/2015 | Arvelo | B21D 53/04 |
| 2006/0219388 A1 * | 10/2006 | Terakado | G06F 1/203 165/80.4 |
| 2007/0034356 A1 * | 2/2007 | Kenny | F04B 17/00 165/80.4 |
| 2007/0070600 A1 * | 3/2007 | Tomioka | F28D 15/0266 361/688 |
| 2008/0084664 A1 * | 4/2008 | Campbell | G06F 1/20 361/699 |

(Continued)

*Primary Examiner* — Steven T Sawyer
*Assistant Examiner* — Yahya Ahmad
(74) *Attorney, Agent, or Firm* — WPAT, PC (57) ABSTRACT

A water-cooling heat dissipating system includes a pump and a water-cooling head. The water-cooling head includes a base, a first chamber and a second chamber. The base is in contact with an electronic component. The first chamber and the second chamber are located over the base and separated from each other. The first chamber includes a first inlet and a first outlet. The first inlet is in fluid communication with the pump. The second chamber includes a second inlet and a second outlet. The second inlet is fluid communication with the first outlet. The liquid continuously flows through the first chamber and the second chamber. The heat from the electronic component is transferred to the liquid within the first chamber and the second chamber through the base, and released through the first outlet and the second outlet.

13 Claims, 5 Drawing Sheets

(56) References Cited

U.S. PATENT DOCUMENTS

| | | | | |
|---|---|---|---|---|
| 2008/0285230 A1* | 11/2008 | Bojan | ................ | H05K 7/20872 361/689 |
| 2010/0314087 A1* | 12/2010 | Daly | ...................... | F25J 1/0022 165/168 |
| 2012/0087088 A1* | 4/2012 | Killion | ................ | F28D 15/0266 361/697 |
| 2013/0027878 A1* | 1/2013 | Campbell | ............ | H05K 7/2029 361/694 |
| 2014/0069614 A1* | 3/2014 | Chiu | ....................... | F28D 15/00 165/104.13 |
| 2016/0338223 A1* | 11/2016 | Tsai | .......................... | F28F 1/00 |
| 2017/0105313 A1* | 4/2017 | Shedd | ................ | H05K 7/20272 |
| 2017/0212560 A1* | 7/2017 | Tsai | ................... | H05K 7/20272 |
| 2017/0347487 A1* | 11/2017 | Rudnicki | ........... | H05K 7/20272 |

\* cited by examiner

FIG.7

WATER-COOLING HEAT DISSIPATING SYSTEM AND WATER-COOLING HEAD

FIELD OF THE INVENTION

The present invention relates to a water-cooling heat dissipating system and a water-cooling head, and more particularly to a water-cooling heat dissipating system for an electronic device and with one or plural water-cooling heads and the structure of the water-cooling head.

BACKGROUND OF THE INVENTION

With increasing development of science and technology, various electronic devices (or computers) such as notebook computers, desktop computers or network servers have become indispensable devices in daily lives of people. Generally, during the operation of the electronic device, the temperature of the electronic components of the electronic device gradually increases. The elevated temperature may result in damage of the electronic components. For solving these problems, the electronic device is usually equipped with a heat dissipating mechanism. In accordance with a conventional heat dissipating mechanism, a fan is used to produce airflow to cool the electronic component through convection, or a heat dissipating unit made of a special material is attached on the electronic component to reduce the temperature through thermal conduction. In addition, a water cooling mechanism is one of the effective and common heat dissipating mechanisms.

The operating principles of the water cooling mechanism will be described as follows. Generally, the water cooling mechanism uses liquid (e.g., water or coolant) as the cooling medium, and uses a continuously-running pump to move the liquid within an applied system along a circulating loop. The liquid flows along sealed pipes. The pipes are distributed to the surfaces of the electronic components (e.g., the central processing unit). When the liquid with the lower temperature flows through the electronic component with the higher temperature, the liquid absorbs the heat from the electronic component to decrease the temperature of the electronic component. Then, through heat exchange, the heat is released from the pipes to the surroundings or another heat dissipating mechanism. Consequently, the temperature of the liquid is decreased. Then, the liquid flows back to the system and flows along the circulating loop to remove the heat.

However, the inner space of the electronic device or the computer is limited, and the water cooling mechanism needs pipes for inputting and outputting the fluid. Moreover, since the pipes are usually crooked, the fluid resistance is increased and it is difficult to move the fluid. Therefore, the way of designing the paths of the pipes is important to the water cooling technology.

Figure 1:
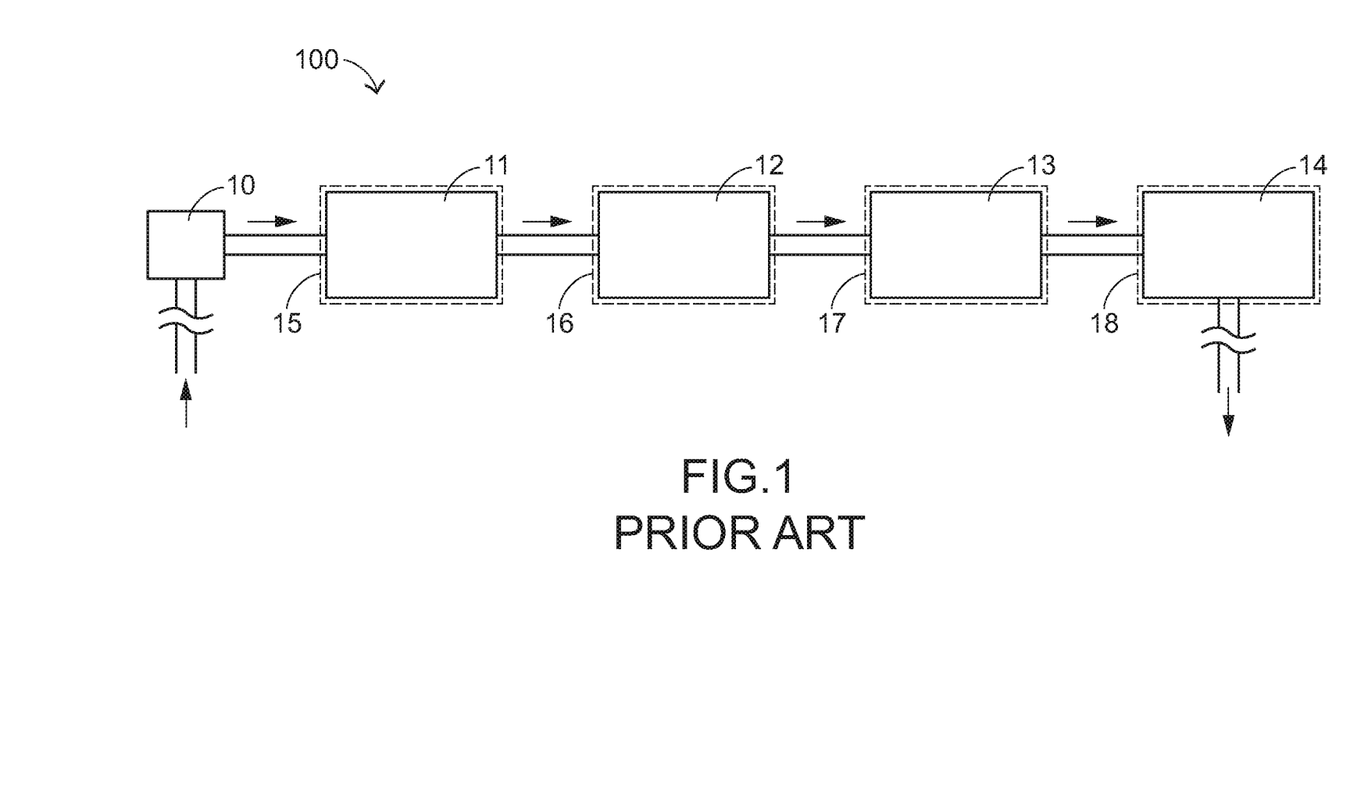
FIG. 1 is a schematic top view illustrating the architecture of a conventional water cooling mechanism.

For effectively utilizing the heat dissipating efficacy of each circulating loop, the pipes of the water cooling mechanism in the system are designed to be simultaneously in contact with plural heat sources (i.e., the electronic components). FIG. 1 is a schematic top view illustrating the architecture of a conventional water cooling mechanism. The water cooling mechanism 100 comprises four water-cooling heads 11, 12, 13 and 14. The inner spaces of the four water-cooling heads 11, 12, 13 and 14 have respective chambers and respective pipes (which are usually made of copper or aluminum) corresponding to the electronic components 15, 16, 17 and 18 so as to remove the heat from the electronic components. The areas of the water-cooling heads 11, 12, 13 and 14 are correlated with the sizes of the electronic components 15, 16, 17 and 18, respectively. Moreover, the electronic components 15, 16, 17 and 18 are in contact with the bottom surfaces of the corresponding electronic components 15, 16, 17 and 18.

As shown in FIG. 1, a liquid flows along a direction indicated by an arrow. The four water-cooling heads 11, 12, 13 and 14 of the water cooling mechanism 100 are connected with each other in series. After the liquid is inputted into the first water-cooling head 11 and outputted from the first water-cooling head 11 by a pump 10, the liquid is inputted into the second water-cooling head 12. The rest may be deduced by analogy. At the time when the liquid is inputted into the first water-cooling head 11, the temperature of the liquid is lower. Consequently, the heat dissipating efficacy is good. However, the heat absorbed and carried by the first water-cooling head 11 cannot be released immediately. That is, the heat is transferred to the second water-cooling head 12, and even transferred to the third water-cooling head 13 and the fourth water-cooling head 14.

In other words, the water-cooling head in the latest stage of the connecting sequence accumulates the greatest amount of heat. That is, the heat dissipating efficacy is the worst. For example, if the heat absorption capability of each water-cooling head as shown in FIG. 1 is 4 degrees Celsius and the three water-cooling heads 11, 12 and 13 simultaneously absorb the heat, the elevated temperature of the latest water-cooling head 14 in serial connection is 16 degrees Celsius according to a simple linear calculation. Under this circumstance, the electronic component is overheated or damaged. As the number of the water-cooling heads that are serially connected with the pipes increases, the amount of the accumulated heat is largely increased.

Therefore, there is a need of providing an improved water-cooling heat dissipating system in order to overcome the drawbacks of the conventional technologies.

SUMMARY OF THE INVENTION

For overcoming the drawbacks of the conventional technologies, the present invention provides a water-cooling heat dissipating system and a water-cooling head. The water-cooling heat dissipating system includes one or plural water-cooling heads. Each water-cooling head includes two separate chambers. At the time when the liquid along the circulating loop is inputted into the water-cooling head, a portion of the absorbed heat is carried away by the liquid within one chamber of the water-cooling head. Consequently, the amount of heat is not extremely accumulated.

In accordance with an aspect of the present invention, there is provided a water-cooling heat dissipating system for an electronic device. The water-cooling heat dissipating system includes a pump and a first water-cooling head. The pump is used for moving a liquid along a circulating loop. The first water-cooling head includes a first base, a first chamber and a second chamber. The first base is in contact with a first electronic component of the electronic device. The first chamber is located over the first base, and includes a first inlet and a first outlet. The first inlet and the first outlet are in fluid communication with the outside of the first chamber. The first inlet is in fluid communication with the pump. The liquid is inputted into the first chamber through the first inlet. The second chamber is located over the first base and separated from the first chamber. The second chamber includes a second inlet and a second outlet. The second inlet and the second outlet are in fluid communication with the outside of the second chamber. The second inlet is in fluid communication with the first outlet. The liquid is inputted into the second chamber through the second inlet. The liquid continuously flows through the first chamber and the second chamber. The heat from the first electronic component during operation is transferred to the liquid within the first chamber and the second chamber through the first base. After heat is absorbed by the liquid within the first chamber and the second chamber, the heat is externally released from the first outlet and the second outlet through the liquid.

In an embodiment, the first water-cooling head further includes a third chamber. The third chamber is separated from the first chamber and the second chamber. The third chamber includes a third inlet and a third outlet. The third inlet and the third outlet are in fluid communication with the outside of the third chamber. The third inlet is in fluid communication with the second outlet. The liquid is inputted into the third chamber through the third inlet.

In an embodiment, the first water-cooling head further includes a casing, which is disposed on the first base and includes a partition structure. When the casing is disposed on the first base, the first chamber and the second chamber are separated from each other by the partition structure.

In an embodiment, the first water-cooling head further includes a casing, the first base includes a partition structure, and the casing disposed on the first base. When the casing is disposed on the first base, the first chamber and the second chamber are separated from each other by the partition structure.

In an embodiment, the first water-cooling head further includes a casing and a partition structure. The casing is disposed on the first base. The partition structure is arranged between the casing and the first base. When the casing is disposed on the first base, the first chamber and the second chamber are separated from each other by the partition structure.

In an embodiment, the first chamber and the second chamber are formed by creating two separate hollow regions in the first water-cooling head.

In an embodiment, the water-cooling heat dissipating system further includes a second water-cooling head. The second water-cooling head includes a second base, a third chamber and a fourth chamber. The second base is in contact with a second electronic component of the electronic device. The third chamber is located over the second base, and includes a third inlet and a third outlet. The third inlet and the third outlet are in fluid communication with the outside of the third chamber. The third inlet is in fluid communication with the first inlet. The liquid is inputted into the third chamber through the third inlet. The fourth chamber is located over the second base and separated from the third chamber. The fourth chamber includes a fourth inlet and a fourth outlet. The fourth inlet and the fourth outlet are in fluid communication with the outside of the fourth chamber. The fourth inlet is in fluid communication with the third outlet. The liquid is inputted into the fourth chamber through the fourth inlet. The second inlet is in fluid communication with the fourth outlet. The second inlet is in fluid communication with the first outlet through the fourth outlet, the fourth inlet, the third outlet and the third inlet. The liquid continuously flows through the third chamber and the fourth chamber. The heat from the second electronic component during operation is transferred to the liquid within the third chamber and the fourth chamber through the second base. After the heat is absorbed by the liquid within the third chamber and the fourth chamber, the heat is externally released from the third outlet and the fourth outlet through the liquid.

In an embodiment, the water-cooling heat dissipating system further includes a radiator. The radiator is arranged between the fourth inlet and the third outlet and in fluid communication with the fourth inlet and the third outlet so as to facilitate removing the heat from the liquid.

In an embodiment, the water-cooling heat dissipating system further includes a radiator. The radiator is arranged between the second inlet and the first outlet and in fluid communication with the second inlet and the first outlet so as to facilitate removing the heat from the liquid.

In an embodiment, the water-cooling heat dissipating system further includes a radiator. The radiator is arranged between the second outlet and the pump and in fluid communication with the second outlet and the pump so as to facilitate removing the heat from the liquid.

In an embodiment, the water-cooling head further includes two protrusion structures. The two protrusion structures are protruded from the base and respectively disposed within the first chamber and the second chamber. The two protrusion structures are in contact with the liquid so as to facilitate transferring the heat through thermal conduction.

In an embodiment, the two protrusion structures are integrally formed, or the two protrusion structures and the base are different components and combined together.

In an embodiment, the two protrusion structures are fin-type heat sinks, or each of the two protrusion structures has one or plural perforations such that a contact area between each protrusion structure and the liquid is increased.

In accordance with another aspect of the present invention, there is provided a water-cooling head for use with a pump and an electronic device. The pump is used for moving a liquid along a circulating loop. The electronic device includes an electronic component. The water-cooling head includes a base, a first chamber and a second chamber. The base is in contact with the electronic component. The first chamber is located over the base, and includes a first inlet and a first outlet. The first inlet and the first outlet are in fluid communication with the outside of the first chamber. The first inlet is in fluid communication with the pump. The liquid is inputted into the first chamber through the first inlet. The second chamber is located over the base, and separated from the first chamber. The second chamber includes a second inlet and a second outlet. The second inlet and the second outlet are in fluid communication with the outside of the second chamber. The second inlet is in fluid communication with the first outlet. The liquid is inputted into the second chamber through the second inlet. The liquid continuously flows through the first chamber and the second chamber. The heat from the electronic component during operation is transferred to the liquid within the first chamber and the second chamber through the base. After the heat is absorbed by the liquid within the first chamber and the second chamber, the heat is externally released from the first outlet and the second outlet through the liquid.

The water-cooling heat dissipating system includes one or plural water-cooling heads. Each of the water-cooling heads includes at least separate chambers. At the time when the liquid along the circulating loop is inputted into the water-cooling head, a portion of the absorbed heat is carried away by the liquid within one chamber of the water-cooling head. Consequently, the amount of heat is not extremely accumulated in the water-cooling head.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
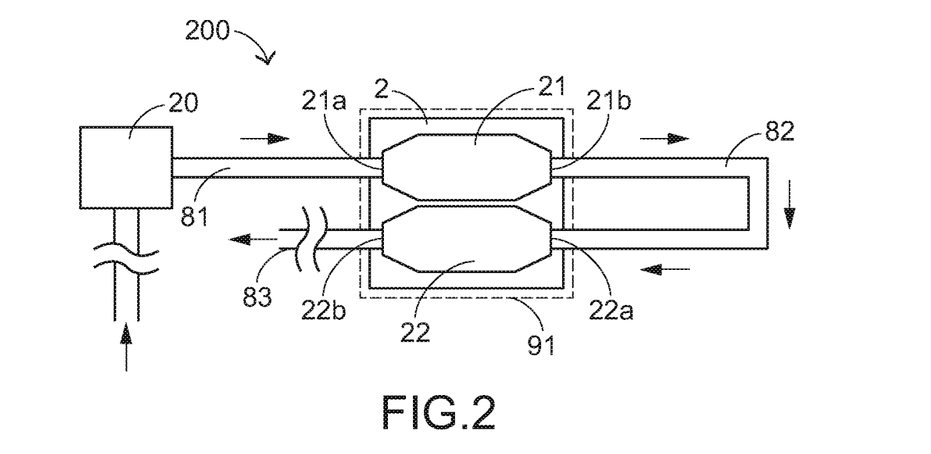
FIG. 2 is a schematic top view illustrating the architecture of a water-cooling heat dissipating system according to a first embodiment of the present invention.

A water-cooling heat dissipating system according to a first embodiment of the present invention will be described as follows. FIG. 2 is a schematic top view illustrating the architecture of a water-cooling heat dissipating system according to a first embodiment of the present invention. The water-cooling heat dissipating system 200 comprises a pump 20 and a water-cooling head 2. The water-cooling heat dissipating system 200 is applied to an electronic device (not shown). For example, the electronic device is a computer. According to the condition or requirement, the pump 20 can be disposed within the electronic device or disposed outside the electronic device. The pump 20 is used for transferring a liquid along a circulating loop in order to dissipate heat through the water cooling mechanism.

In this embodiment, other heat dissipating mechanism and the details paths of the pipes are not shown in the drawing. For example, the radiator for allowing the heat exchange between the liquid and the surroundings and the water tank for storing the liquid are not shown. It is noted that these components may be installed according to the existing technologies and practical requirements. In FIG. 1, the liquid flows along a direction indicated by an arrow. Moreover, three pipes 81, 82 and 83 of the water-cooling heat dissipating system 200 are distributed inside or outside the electronic device according to the installation of the radiator or the water tank.

In this embodiment, the water-cooling head 2 is in contact with an electronic component 91 of the electronic device. For example, the electronic component 91 is a central processing unit of a computer, which is a main heat source during operation of the computer. As shown in FIG. 2, one water-cooling head 2 corresponds to one electronic component (heat source) 91. The water-cooling head 2 is disposed on the electronic component 91 and externally connected with the three pipes 81, 82 and 83. That is, the water-cooling head 2 comprises two outlets and two inlets, including a first inlet 21a, a first outlet 21b, a second inlet 22a and a second outlet 22b. Consequently, the liquid as shown in FIG. 2 flows in two opposite directions with respect to the same electronic component 91.

Figure 3:
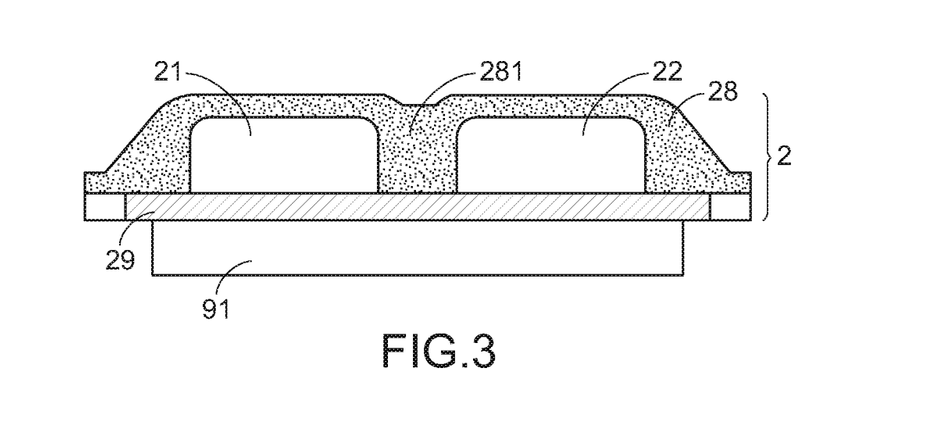
FIG. 3 is a schematic cross-sectional side view illustrating the water-cooling head of the water-cooling heat dissipating system as shown in FIG. 2.

FIG. 3 is a schematic cross-sectional side view illustrating the water-cooling head of the water-cooling heat dissipating system as shown in FIG. 2. That is, FIG. 3 is a cross-sectional view of FIG. 2 and taken along the line through the first inlet 21a and the second outlet 22b. As shown in FIGS. 2 and 3, the water-cooling head 2 comprises a casing 28, a base 29, a first chamber 21 and a second chamber 22. The base 29 is in contact with the electronic component 91, and thus the water-cooling head 2 is installed on the electronic component 91. In this embodiment, the base 29 is a heatsink plate. For example, the base 29 is a bottom plate that is made of copper, aluminum or any other appropriate metallic material. Consequently, the base 29 can absorb the heat from the electronic component 91 during operation. The size of the base 29 matches the size of the electronic component 91.

In this embodiment, the casing 28 and the base 29 are composed of two different elements. After the casing 28 and the base 29 are produced, the casing 28 and the base 29 are assembled as the main body of the water-cooling head 2. The casing 28 comprises a partition structure 281. When the casing 28 is disposed on the base 29, the space between the casing 28 and the base 29 is divided into the first chamber 21 and the second chamber 22 through the partition structure 281. That is, the first chamber 21 and the second chamber 22 are located over the base 29 and separated from each other through the partition structure 281. The first chamber 21 comprises the first inlet 21a and the first outlet 21b, which are in fluid communication with the surroundings. The second chamber 22 comprises the second inlet 22a and the second outlet 22b, which are in fluid communication with the surroundings.

The first inlet 21a is in fluid communication with the pump 20. In this embodiment, the first inlet 21a is directly connected with the pump 20 through the pipe 81. Consequently, the liquid is inputted into the chamber 21 through the first inlet 21a. The second inlet 22a is in fluid communication with the first outlet 21b. In this embodiment, the second inlet 22a is directly connected with the first outlet 21b through the pipe 82. After the liquid is outputted from the first outlet 21b, the liquid is inputted into the second chamber 22 through the second inlet 22a. Afterwards, the liquid is outputted from the second outlet 22b.

In other words, the first chamber 21 and the second chamber 22 over the electronic component 91 are two separate fluid channels. That is, when the liquid is inputted into the first chamber 21 or the second chamber 22, the liquid will not flow into the adjacent chamber. Since the size of the base 29 matches the size of the electronic component 91, the heat from the operating electronic component 91 is transferred upwardly to the entire of the base 29 through thermal conduction. The heat is absorbed by the liquid within the first chamber 21 and the second chamber 22. Then, the liquid is outputted from the first outlet 21b and the second outlet 22b and released.

In accordance with the above design, the heat from the electronic component 91 is distributed to the two chambers 21 and 22 and outputted to two different targets through the two outlets 21*b* and 22*b*. In other words, the heat from the electronic component 91 is not completely transferred to the same target. Consequently, the heat is not extremely accumulated. The water-cooling heat dissipating system as shown in FIG. 2 is presented herein for purpose of illustration and description only. For example, the water-cooling heat dissipating system is equipped with an additional heat dissipating mechanism. Moreover, the pipe 82 for connecting the second inlet 22*a* with the first outlet 21*b* is exposed outside the computer, and the pipe 82 is cooled down by the ambient air.

As mentioned above, the liquid can continuously flow through the first chamber 21 and the second chamber 22, or the liquid continuously flows through the pipes of the overall system along the circulating loop. Moreover, the liquid in the first chamber 21 and the liquid in the second chamber 22 at a time point will not mix with each other in the second chamber 22 at a next time point because the liquid in the second chamber 22 is pushed forwardly. Under this circumstance, a portion of the heat is carried away. Although the liquid in the first chamber 21 and the liquid in the second chamber 22 absorb heat simultaneously, the heat is transferred to different targets. For example, the targets include an additional water-cooling head, an additional heat dissipating mechanism, the pump or the surroundings. Since only a portion of the heat is transferred or dissipated from the first chamber 21 and the second chamber 22 to the next targets, the temperature is not obviously elevated or the amount of the heat to be dissipated is reduced.

In other words, the water-cooling heat dissipating system is effective to overcome the drawbacks of the conventional technologies.

In the first embodiment as shown in FIGS. 2 and 3, the sizes and the shapes of the first chamber 21 and the second chamber 22 are identical. It is noted that the sizes and the shapes of the first chamber and the second chamber may be varied according to the practical requirements. For example, during the operation of the central processing unit, the heat in some sites is not uniformly generated. These sites are often referred as hot spots. For applying the water-cooling head to the corresponding electronic component, the water-cooling head is properly modified. For example, the two chambers have different sizes. One chamber is larger, and the other chamber is smaller. Alternatively, the partition structure between the two chambers had a crooked shape or a special shape.

In the first embodiment as shown in FIG. 3, the partition structure 281 is a part of the casing 28. It is noted that numerous modifications and alterations may be made while retaining the teachings of the present invention. For example, in another embodiment, the partition structure is a part of the base. When the casing is installed on the base, the two separate chambers are defined by the partition structure. Alternatively, the partition structure is an individual component of the water-cooling head. The partition structure is arranged between the casing and the base through an assembling process. When the casing is installed on the base, the two separate chambers are defined by the partition structure. Alternatively, the main body of the water-cooling head is integrally formed. In addition, the two separate chambers are formed by creating hollow regions in the main body.

In the first embodiment of the water-cooling heat dissipating system 200, a single water-cooling head 2 with two chambers 21 and 22 is used to remove the heat from the electronic component 91. It is noted that numerous modifications and alterations may be made while retaining the concepts of the first embodiment. That is, the similar structural design can achieve the similar efficacy and object.

Figure 4:
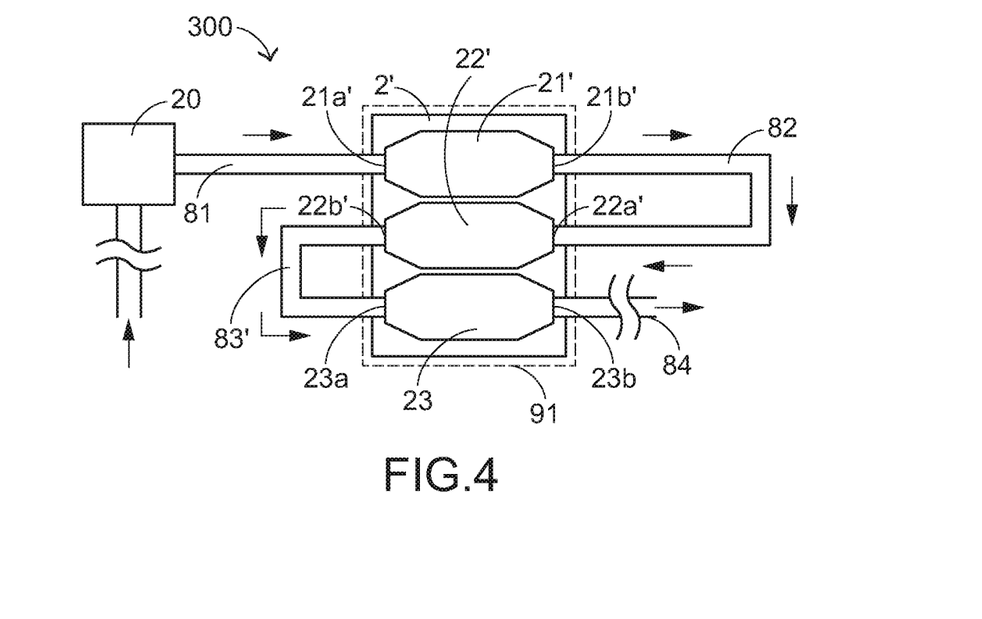
FIG. 4 is a schematic top view illustrating the architecture of a water-cooling heat dissipating system according to a second embodiment of the present invention.
Figure 5:
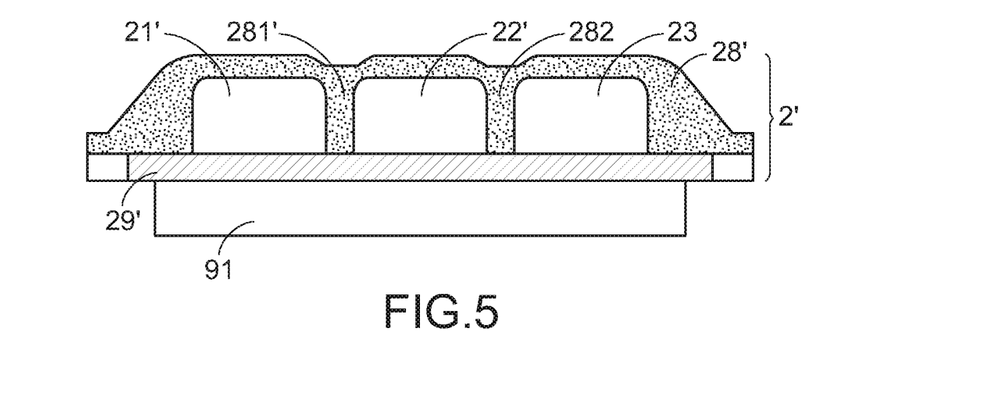
FIG. 5 is a schematic cross-sectional side view illustrating the water-cooling head of the water-cooling heat dissipating system as shown in FIG. 4.

A water-cooling heat dissipating system according to a second embodiment of the present invention will be described with reference to FIGS. 4 and 5. FIG. 4 is a schematic top view illustrating the architecture of a water-cooling heat dissipating system according to a second embodiment of the present invention. FIG. 5 is a schematic cross-sectional side view illustrating the water-cooling head of the water-cooling heat dissipating system as shown in FIG. 4. Component parts and elements corresponding to those of the first embodiment are designated by identical numeral references, and detailed descriptions thereof are omitted. In comparison with the first embodiment, the water-cooling head 2' of the second embodiment comprises more chambers.

In this embodiment, the water-cooling head 2' comprises a casing 28', a base 29', a first chamber 21', a second chamber 22' and a third chamber 23. The casing 28' comprises two partition structures 281' and 282. When the casing 28' is disposed on the base 29', the space between the casing 28' and the base 29' is divided into the first chamber 21', the second chamber 22' and the third chamber 23 through the partition structures 281' and 282. The first chamber 21' comprises a first inlet 21*a'* and a first outlet 21*b'*, which are in fluid communication with the surroundings. The second chamber 22' comprises a second inlet 22*a'* and a second outlet 22*b'*, which are in fluid communication with the surroundings. The third chamber 23 comprises a third inlet 23*a* and a third outlet 23*b*, which are in fluid communication with the surroundings.

In this embodiment, the first inlet 21*a'* is connected with a pump 20 through a pipe 81. Consequently, the liquid is inputted into the chamber 21' through the first inlet 21*a'*. The second inlet 22*a'* is in fluid communication with the first outlet 21*b'* through a pipe 82. After the liquid is outputted from the first outlet 21*b'*, the liquid is inputted into the second chamber 22' through the second inlet 22*a'*. The third inlet 23*a* is in fluid communication with the second outlet 22*b'* through a pipe 83'. After the liquid is outputted from the second outlet 22*b'*, the liquid is inputted into the third chamber 23 through the third inlet 23*a*. Afterwards, the liquid is outputted from the third outlet 23*b* and inputted into a pipe 84. Consequently, the liquid flows along a circulating loop.

Similarly, the heat from the operating electronic component 91 is transferred upwardly to the entire of the base 29' through thermal conduction. The heat is absorbed by the liquid within the first chamber 21', the second chamber 22' and the third chamber 23. Then, the liquid is outputted from the first outlet 21*b'*, the second outlet 22*b'* and the third outlet 23*b* and released.

In accordance with the above design, the heat from the electronic component 91 is distributed to the three chambers 21', 22' and 23 and outputted to three different targets through the two outlets 21*b'*, 22*b'* and 23*b*. In other words, the heat from the electronic component 91 is transferred to different targets. Moreover, since a portion of the heat is dissipated away by the liquid within the rear chamber, the temperature is not obviously elevated.

From the descriptions of the above two embodiments, the water-cooling heat dissipating system of the present invention comprises plural water-cooling heads, which are connected with each other in series. The water-cooling heat dissipating system is used for removing the heat from the plural electronic components in the same electronic device (e.g., two central processing units or other chip units on the same circuit board). In comparison with the conventional technologies, the heat dissipating efficacy of the water-cooling heat dissipating system of the present invention is largely enhanced.

Figure 6:
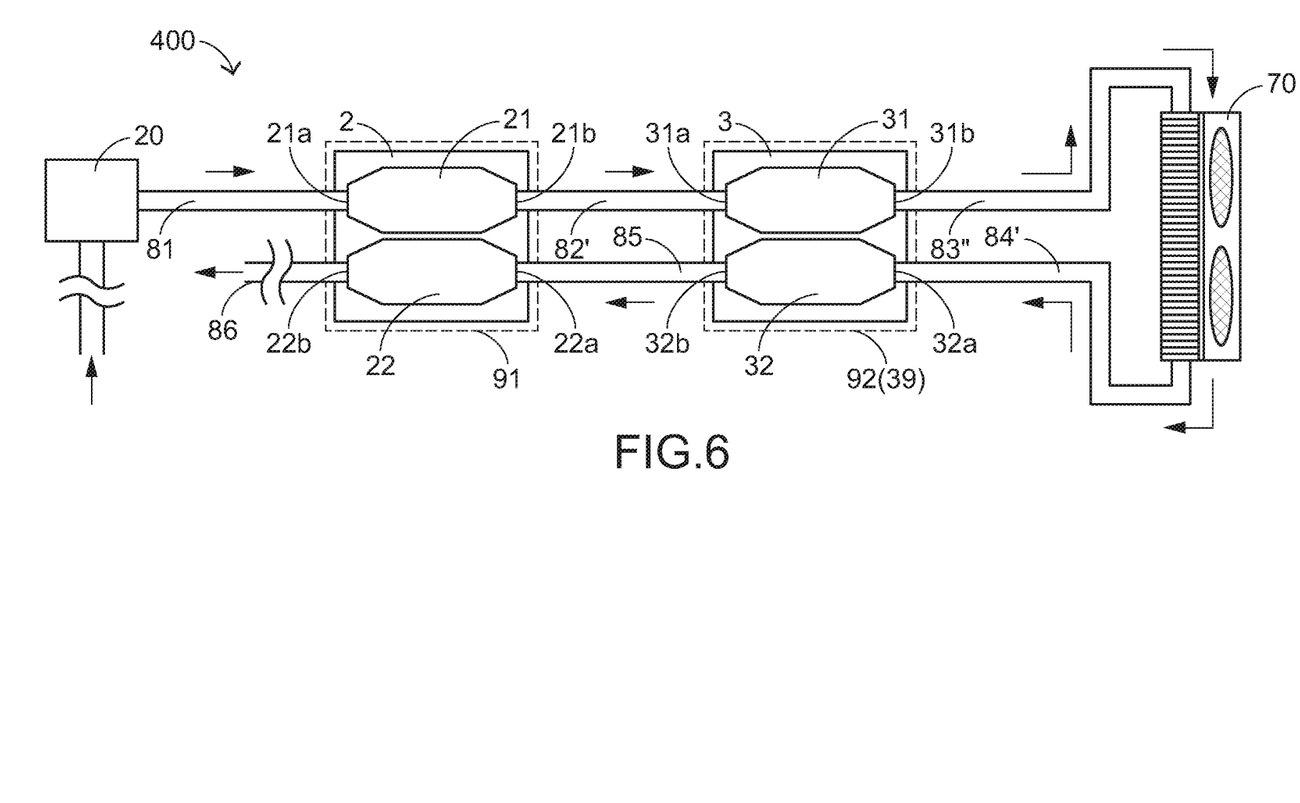
FIG. 6 is a schematic top view illustrating the architecture of a water-cooling heat dissipating system according to a third embodiment of the present invention.

A water-cooling heat dissipating system according to a third embodiment of the present invention will be described as follows. FIG. 6 is a schematic top view illustrating the architecture of a water-cooling heat dissipating system according to a third embodiment of the present invention. Component parts and elements corresponding to those of the first embodiment are designated by identical numeral references, and detailed descriptions thereof are omitted. In comparison with the first embodiment, plural water-cooling heads of the third embodiment are connected with each other in series, and the pipe of the circulating pipe is additionally equipped with a heat dissipating mechanism.

In this embodiment, the water-cooling heat dissipating system 400 comprises two water-cooling heads 2, 3 and a radiator 70. The two water-cooling heads 2 and 3 are connected with each other in series. Moreover, the two water-cooling heads 2 and 3 are serially connected with the radiator 70 to dissipate the heat. In this embodiment, the water-cooling heads 2 and 3 have the same structure. Like the first embodiment, each of the water-cooling heads comprises two chambers. The radiator 70 is a fan, a fin-type heat sink, or a combination of a fan and a fin-type heat sink. The heated liquid and the cool air in the surroundings exchange heat. Consequently, the heat of the liquid is dissipated away and the temperature of the liquid is reduced.

In this embodiment, a first inlet 21*a* of a first chamber 21 of the water-cooling head 2 is in fluid communication with a pump 20 through a pipe 81. Moreover, a third inlet 31*a* of a third chamber 31 of the water-cooling head 3 is in fluid communication with a first outlet 21*b* of the first chamber 21 through a pipe 82'. The radiator 70 is in fluid communication with a third outlet 31*b* of the third chamber 31 through a pipe 83". In addition, the radiator 70 is in fluid communication with a fourth inlet 32*a* of a fourth chamber 32 of the water-cooling head 3 through a pipe 84'. A second inlet 22*a* of a second chamber 22 of the water-cooling head 2 is in fluid communication with a fourth outlet 32*b* of the fourth chamber 32 through a pipe 85. Consequently, the liquid flows through the first chamber 21, the third chamber 31, the radiator 70, the fourth chamber 32 and the second chamber 22 sequentially. Afterwards, the liquid is outputted from a second outlet 22*b* of the second chamber 22 and inputted into a pipe 86. Consequently, the liquid flows along a circulating loop.

Moreover, a base 39 of the water-cooling head 3 (which is similar to the base 29 of FIG. 3) is in contact with another electronic component 92. Consequently, the water-cooling head 3 is disposed on the base 39. Similarly, the heat from the operating electronic component 92 is transferred upwardly to the entire of the base 39 through thermal conduction. The heat is absorbed by the liquid within the third chamber 31 and the fourth chamber 32. Then, the liquid is outputted from the third outlet 31*b* and the fourth outlet 32*b* and released.

Similarly, after the liquid in the first chamber 21 absorbs the heat from the electronic component 91, the heat is carried by the liquid and transferred to the third chamber 31. As mentioned in the first embodiment, the heat is only a portion of the heat from the operating electronic component 91. At the same time, another portion of the heat from the operating electronic component 91 is absorbed by the liquid in the second chamber 22 and outputted from the second outlet 22*b*. Consequently, the amount of the accumulated heat in the third chamber 31 includes only a portion of the heat from the electronic component 91 and a portion of the heat from the electronic component 92. In other words, the amount of the accumulated heat in the third chamber 31 is not equal to the sum of the heat from the electronic component 91 and the heat from the electronic component 92.

Similarly, the amount of the accumulated heat in the second chamber 22 includes a proof the heat from the electronic component 91, the heat released from the fourth chamber 32, the heat released from the third chamber 31 and the heat released from the first chamber 21. Since the radiator 70 is helpful to dissipate away the heat, a greater portion of the heat released from the third chamber 31 and the first chamber 21 is reduced.

In case that the water-cooling heat dissipating system of FIG. 6 is not equipped with the radiator 70, the result of a computer simulation indicates that the amount of accumulated heat or the temperature increase in the second chamber 22 of FIG. 6 is the highest among the four chambers. Moreover, the overall temperature increase of the water-cooling head 3 at the rear stage of the serially-connected water-cooling heads is not the highest, or the overall temperature increase of the water-cooling head 3 at the rear stage of the serially-connected water-cooling heads is substantially equal to the overall temperature increase of the water-cooling head 2 at the front stage of the serially-connected water-cooling heads.

It is found that the temperature increase of the second chamber 22 is relatively higher. However, the temperature of the first chamber 21 is the lowest, and the second chamber 22 is located at the front stage of the serially-connected water-cooling heads. Consequently, at the time when the liquid along the circulating loop is inputted into the second chamber 22, a portion of the heat of the liquid is carried away and released immediately. Under this circumstance, the total amount of the heat from the two electronic components 91 and 92 are averagely distributed to the water-cooling head 2 and the water-cooling head 3. Even if the heat from the fourth chamber 32, the third chamber 31 and the first chamber 21 is transferred to the second chamber 22, the amount of the accumulated heat in each chamber or each water-cooling head is not very high. Consequently, the problems of the conventional technologies as described in FIG. 1 are effectively overcome.

In the third embodiment, the radiator 70 is arranged between and in fluid communication with the fourth inlet 32*a* and the third outlet 31*b*. It is noted that numerous modifications and alterations may be made while retaining the teachings of the present invention. The installation position or the number of the radiator may be varied according to the practical requirements.

For example, the water-cooling heat dissipating system of the first embodiment is additionally equipped with a radiator. The radiator is arranged between and in fluid communication with the second inlet 22*a* and the first outlet 21*b*, or the radiator is arranged between and in fluid communication with the second outlet 22*b* and the pump 20. Similarly, the water-cooling heat dissipating system of the second embodiment is additionally equipped with a radiator. The radiator is arranged between and in fluid communication with the second outlet 22*b*' and the third inlet 23*a*. Similarly, the water-cooling heat dissipating system of the third embodiment is equipped with an additional radiator (or equipped with one radiator). The radiator is arranged between the two water-cooling heads 2 and 3. The third inlet 31*a* is in fluid communication with the first outlet 21b through the radiator, and the second inlet 22a is in fluid communication with the fourth outlet 32b through the radiator.

In the above embodiments, the base of the water-cooling head is made of a metallic material with high conductivity (e.g., copper or aluminum). Consequently, when the base of the water-cooling head is in contact with the electronic component, the heat can be effectively transferred by the water-cooling head. Moreover, for transferring the heat from the base to the overlying liquid and allowing the liquid to absorb the heat, the contact area between the base and the liquid is the important factor influencing the heat dissipating efficacy.

Figure 7:
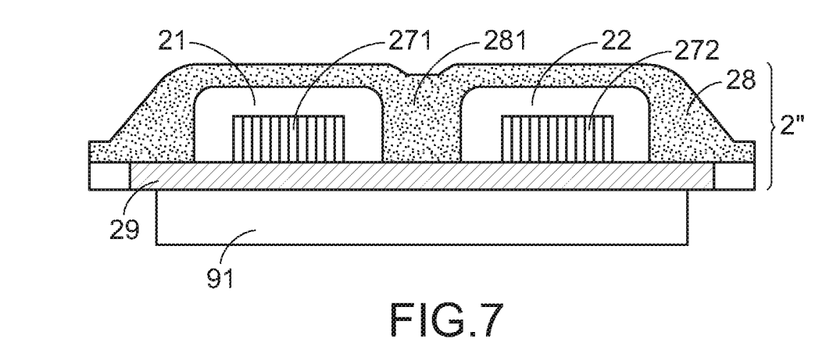
FIG. 7 is a schematic cross-sectional side view illustrating a water-cooling head of a water-cooling heat dissipating system according to a fourth embodiment of the present invention.

A water-cooling heat dissipating system according to a fourth embodiment of the present invention will be described as follows. FIG. 7 is a schematic cross-sectional side view illustrating a water-cooling head of a water-cooling heat dissipating system according to a fourth embodiment of the present invention. Component parts and elements corresponding to those of the first embodiment are designated by identical numeral references, and detailed descriptions thereof are omitted. In comparison with the first embodiment (especially FIG. 3), the water-cooling head 2″ of the fourth embodiment further comprises two protrusion structures 271 and 272.

The two protrusion structures 271 and 272 are disposed on the base 29 and respectively disposed within the first chamber 21 and the second chamber 22. That is, the protrusion structure 271 is protruded upwardly from the base 29 to the first chamber 21, and the protrusion structure 272 is protruded upwardly from the base 29 to the second chamber 22. When the liquid flows through the first chamber 21 and the second chamber 22, the liquid is contacted with the two protrusion structures 271 and 272. Since the contact area is increased, the heat from the electronic component 91 is further transferred to the liquid through the two protrusion structures 271 and 272 through thermal conduction. Consequently, the heat of the liquid can be absorbed by the liquid more quickly.

In the fourth embodiment as shown in FIG. 7, the two protrusion structures 271 and 272 and the base 29 are different components, and the two protrusion structures 271 and 272 are combined with the base 29. Although the protrusion structures 271 and 272 and the base 29 are different components, the protrusion structures 271 and 272 and the base 29 may be made of the identical material or different materials.

It is noted that numerous modifications and alterations may be made while retaining the teachings of the present invention. For example, in another embodiment, the protrusion structures are integrally formed with the base. That is, by directly machining a heatsink plate, the two protrusion structures are formed at the desired positions. In a further embodiment, the two protrusion structures are fin-type heat sinks. Alternatively, one or plural perforations are formed in the protrusion structures. Consequently, the contact areas between the protrusion structures and the liquid are increased.

Moreover, the concepts and the variant examples of the protrusion structures of the fourth embodiment may be applied to the second embodiment and the third embodiment. In addition, the number of the protrusion structures is equal to the number of the chambers of each water-cooling head. That is, one protrusion structure is disposed within each chamber.

According to the concepts mentioned in the four embodiments of the present invention, the paths of the pipes or the pressure of transferring the liquid should be taken into consideration. The water-cooling heat dissipating system and the water-cooling head of the present invention can be used to remove the heat from plural electronic components on the same plane and in the electronic device (e.g., plural central processing units or chip units on the same circuit board). However, the applications of the present invention are not restricted.

For example, if the pressure generated by the pump is able to transfer the liquid upwardly and downwardly, the paths of the pipes may be distributed within a three-dimensional space in a vertical arrangement. Consequently, the water-cooling heat dissipating system can be used to remove the heat from different planes (e.g., plural circuit boards or the circuit with a multi-layer circuitry structure). The plural chambers of the water-cooling head of the present invention may be arranged side by side along a horizontal direction. Moreover, more chambers may be stacked on each other along a vertical direction and arranged side by side. Consequently, the single electronic component will have more heat dissipating pipes, and the heat dissipating efficacy is further enhanced.

From the above descriptions, the water-cooling heat dissipating system and the water-cooling head of the present invention can effectively overcome the heat dissipating problems of the conventional serially-connected water cooling mechanism. At the time when the liquid along the circulating loop is inputted into the front-stage water-cooling head, a portion of the heat from the electronic component is carried away and released by the liquid within one chamber of the water-cooling head. Consequently, even if many water-cooling heads are serially connected each other, the amount of heat is not extremely accumulated and the temperature is not obviously increased.

Consequently, the water-cooling heat dissipating system and the water-cooling head of the present invention can effectively solve the drawbacks of the conventional technology while achieving the purposes of the present invention.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A water-cooling heat dissipating system for an electronic device, the water-cooling heat dissipating system comprising:

a pump for moving a liquid along a circulating loop;

a first water-cooling head comprising:

a first base in contact with a first electronic component of the electronic device;

a first chamber located over the first base, and comprising a first inlet and a first outlet, wherein the first inlet and the first outlet are in fluid communication with the outside of the first chamber, the first inlet is in fluid communication with the pump, and the liquid is inputted into the first chamber through the first inlet; and         a second chamber located over the first base, separated from the first chamber, and comprising a second inlet and a second outlet, wherein the second inlet and the second outlet are in fluid communication with the outside of the second chamber, and the liquid is inputted into the second chamber through the second inlet, wherein the liquid continuously flows through the first chamber and the second chamber, and a heat from the first electronic component during operation is transferred to the liquid within the first chamber and the second chamber through the first base, wherein after the heat is absorbed by the liquid within the first chamber and the second chamber, the heat is externally released from the first outlet and the second outlet through the liquid; and a second water-cooling head comprising:
  a second base in contact with a second electronic component of the electronic device;
  a third chamber located over the second base, and comprising a third inlet and a third outlet, wherein the third inlet and the third outlet are in fluid communication with the outside of the third chamber, the third inlet is in fluid communication with the first outlet, and the liquid is inputted into the third chamber through the third inlet; and
  a fourth chamber located over the second base, separated from the third chamber, and comprising a fourth inlet and a fourth outlet, wherein the fourth inlet and the fourth outlet are in fluid communication with the outside of the fourth chamber, the fourth inlet is in fluid communication with the third outlet, and the liquid is inputted into the fourth chamber through the fourth inlet,
  wherein the second inlet is in fluid communication with the fourth outlet, and the second inlet is in fluid communication with the first outlet through the fourth outlet, the fourth inlet, the third outlet and the third inlet,
  wherein the liquid continuously flows through the third chamber and the fourth chamber, and a heat from the second electronic component during operation is transferred to the liquid within the third chamber and the fourth chamber through the second base, wherein after the heat is absorbed by the liquid within the third chamber and the fourth chamber, the heat is externally released from the third outlet and the fourth outlet through the liquid.

2. The water-cooling heat dissipating system according to claim 1, wherein the first water-cooling head further comprises another chamber, wherein the other chamber is separated from the first chamber and the second chamber, and the other chamber comprises an inlet and an outlet, wherein the inlet and the outlet are in fluid communication with the outside of the other chamber, the inlet is in fluid communication with the second outlet, and the liquid is inputted into the other chamber through the inlet.

3. The water-cooling heat dissipating system according to claim 1, wherein the first water-cooling head further comprises a casing, which is disposed on the first base and comprises a partition structure, wherein when the casing is disposed on the first base, the first chamber and the second chamber are separated from each other by the partition structure.

4. The water-cooling heat dissipating system according to claim 1, wherein the first water-cooling head further comprises a casing, the first base comprises a partition structure, and the casing is disposed on the first base, wherein when the casing is disposed on the first base, the first chamber and the second chamber are separated from each other by the partition structure.

5. The water-cooling heat dissipating system according to claim 1, wherein the first water-cooling head further comprises a casing and a partition structure, wherein the casing is disposed on the first base, and the partition structure is arranged between the casing and the first base, wherein when the casing is disposed on the first base, the first chamber and the second chamber are separated from each other by the partition structure.

6. The water-cooling heat dissipating system according to claim 1, wherein the first chamber and the second chamber are formed by creating two separate hollow regions in the first water-cooling head.

7. The water-cooling heat dissipating system according to claim 1, wherein the water-cooling heat dissipating system further comprises a radiator, wherein the radiator is arranged between the fourth inlet and the third outlet and in fluid communication with the fourth inlet and the third outlet so as to facilitate removing the heat from the liquid.

8. The water-cooling heat dissipating system according to claim 1, wherein the water-cooling heat dissipating system further comprises a radiator, wherein the radiator is arranged between the second inlet and the first outlet and in fluid communication with the second inlet and the first outlet so as to facilitate removing the heat from the liquid.

9. The water-cooling heat dissipating system according to claim 1, wherein the water-cooling heat dissipating system further comprises a radiator, wherein the radiator is arranged between the second outlet and the pump and in fluid communication with the second outlet and the pump so as to facilitate removing the heat from the liquid.

10. The water-cooling heat dissipating system according to claim 1, wherein the water-cooling head further comprises two protrusion structures, wherein the two protrusion structures are protruded from the base and respectively disposed within the first chamber and the second chamber, and the two protrusion structures are in contact with the liquid so as to facilitate transferring the heat through thermal conduction.

11. The water-cooling heat dissipating system according to claim 10, wherein the two protrusion structures are integrally formed, or the two protrusion structures and the base are different components and combined together.

12. The water-cooling heat dissipating system according to claim 10, wherein the two protrusion structures are fin-type heat sinks, or each of the two protrusion structures has one or plural perforations such that a contact area between each protrusion structure and the liquid is increased.

13. A first water-cooling head and a second water-cooling head for use with a pump and an electronic device, the pump moving a liquid along a circulating loop, the electronic device comprising a first electronic component and a second electronic component, the first water-cooling head comprising:
  a first base in contact with the first electronic component;
  a first chamber located over the first base, and comprising a first inlet and a first outlet, wherein the first inlet and the first outlet are in fluid communication with the outside of the first chamber, the first inlet is in fluid communication with the pump, and the liquid is inputted into the first chamber through the first inlet; and
  a second chamber located over the first base, separated from the first chamber, and comprising a second inlet and a second outlet, wherein the second inlet and the second outlet are in fluid communication with the outside of the second chamber, and the liquid is inputted into the second chamber through the second inlet, wherein the liquid continuously flows through the first chamber and the second chamber, and a heat from the first electronic component during operation is transferred to the liquid within the first chamber and the second chamber through the first base, wherein after the heat is absorbed by the liquid within the first chamber and the second chamber, the heat is externally released from the first outlet and the second outlet through the liquid; and the second water-cooling head comprising:
- a second base in contact with the second electronic component;
- a third chamber located over the second base, and comprising a third inlet and a third outlet, wherein the third inlet and the third outlet are in fluid communication with the outside of the third chamber, the third inlet is in fluid communication with the first outlet, and the liquid is inputted into the third chamber through the third inlet; and
- a fourth chamber located over the second base, separated from the third chamber, and comprising a fourth inlet and a fourth outlet, wherein the fourth inlet and the fourth outlet are in fluid communication with the outside of the fourth chamber, the fourth inlet is in fluid communication with the third outlet, and the liquid is inputted into the fourth chamber through the fourth inlet, wherein the second inlet is in fluid communication with the fourth outlet, and the second inlet is in fluid communication with the first outlet through the fourth outlet, the fourth inlet, the third outlet and the third inlet, wherein the liquid continuously flows through the third chamber and the fourth chamber, and a heat from the second electronic component during operation is transferred to the liquid within the third chamber and the fourth chamber through the second base, wherein after the heat is absorbed by the liquid within the third chamber and the fourth chamber, the heat is externally released from the third outlet and the fourth outlet through the liquid.

* * * * *